US012154643B2

(12) United States Patent
Ostertun

(10) Patent No.: US 12,154,643 B2
(45) Date of Patent: Nov. 26, 2024

(54) NON-VOLATILE MEMORY SYSTEM WITH SECURE DETECTION OF VIRGIN MEMORY CELLS

(71) Applicant: NXP B.V., Eindhoven (NL)

(72) Inventor: Soenke Ostertun, Wedel (DE)

(73) Assignee: NXP B.V., Eindhoven (NL)

( * ) Notice: Subject to any disclaimer, the term of this patent is extended or adjusted under 35 U.S.C. 154(b) by 169 days.

(21) Appl. No.: 18/084,704

(22) Filed: Dec. 20, 2022

(65) Prior Publication Data

US 2024/0203518 A1 Jun. 20, 2024

(51) Int. Cl.
*G11C 7/24* (2006.01)
*G11C 29/40* (2006.01)
*G11C 29/46* (2006.01)
*G11C 29/12* (2006.01)

(52) U.S. Cl.
CPC ............... *G11C 29/46* (2013.01); *G11C 7/24* (2013.01); *G11C 29/40* (2013.01); *G11C 2029/1204* (2013.01)

(58) Field of Classification Search
CPC ........... G11C 29/46; G11C 7/24; G11C 29/40; G11C 2029/1204; G11C 2029/0407; G11C 29/50; G11C 2029/5002; G11C 7/20; G11C 29/50008; G11C 2013/0083
See application file for complete search history.

(56) References Cited

U.S. PATENT DOCUMENTS

| | | | |
|---|---|---|---|
| 8,917,533 B2 | 12/2014 | Chung | |
| 10,923,204 B2 | 2/2021 | Chung | |
| 2010/0244023 A1 | 9/2010 | Parkinnson | |
| 2018/0005703 A1* | 1/2018 | Chung | ........ H10B 63/20 |
| 2019/0189230 A1 | 6/2019 | Chung | |

FOREIGN PATENT DOCUMENTS

| | | |
|---|---|---|
| EP | 0997913 B1 | 8/2005 |
| GB | 2173367 A | 10/1986 |

* cited by examiner

*Primary Examiner* — Xiaochun L Chen

(57) ABSTRACT

In a non-volatile memory (NVM) system of a memory device, a memory controller connected to memory cell arrays of the NVM system is configured to perform the steps of selecting a memory cell to test, energizing a test circuit connected to the memory cell under a first biasing condition, reading a measurement of an electrical property of the memory cell, and determining, based on the measurement, whether the memory cell is formed or unformed. In embodiments, the system and method include protecting the test circuit from attack by validating the results of the testing. The memory controller is further configured to energize the test circuit under a second biasing condition that produces a known test result whether the memory cell is formed or unformed; if the result of the second test is not the expected result, the memory controller determines that the testing circuit is malfunctioning or under attack.

20 Claims, 11 Drawing Sheets

NON-VOLATILE MEMORY SYSTEM WITH SECURE DETECTION OF VIRGIN MEMORY CELLS

TECHNICAL FIELD

Embodiments of the subject matter described herein relate generally to electronic memory systems, and more particularly to memory systems configured to securely check whether or not memory cells have ever had data written to them.

BACKGROUND

Many devices use nonvolatile memory (NVM) to store information that must be retained by the device even when power to the device is removed. For example, smart card systems use nonvolatile memories in small embedded integrated circuits (e.g., embedded in a pocket-sized card) to store identifying information. This information could be private, proprietary, or secret, enabling advanced functionality such as payment, data storage, or authentication functions to be implemented by the smart card. Such secret data must be protected from unauthorized access; smart cards, trusted platform modules, and similar devices may use embedded NVM to obviate the need for accessing the memory using external/peripheral equipment.

But, electrical testing of the devices requires access to the NVM by test hardware during test procedures that occur after the NVM is produced. In most cases, the memory content after production but before test is unknown; consequently, reading the content of the memory to distinguish tested from untested devices can only be done by writing a specific data pattern to a specific location of the memory, which is not expected to appear by chance during production. The test access must then be disabled after testing is completed to avoid a potential security threat.

Some types of NVM, such as resistive random-access memory (RRAM), undergo a "forming" process that includes preparation, by electrical means, of the memory cells to have data written to them. "Forming" is part of a test procedure that begins directly after production. Before forming occurs, the memory cells exhibit different properties, e.g. extremely high resistance, which disappear after the forming process. Advantageously, electrically measuring these properties may allow differentiation of a pre-formed, or "virgin," memory cell from memory cells that hold or are prepared to hold data.

A test procedure that were to include a "virgin" check may be conducted before the memory cells are formed; consequently, the check would occur during the boot process or otherwise before the test interface is made available for use. The check might be vulnerable to attack (e.g., from a hacker) if the timing of the check were known or could reasonably be guessed at. A properly-timed attack could trick the test interface into reading the NVM condition as "virgin" when the NVM actually has secret data written to it. Techniques are needed for protecting the "virgin memory" check from attack in this manner.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
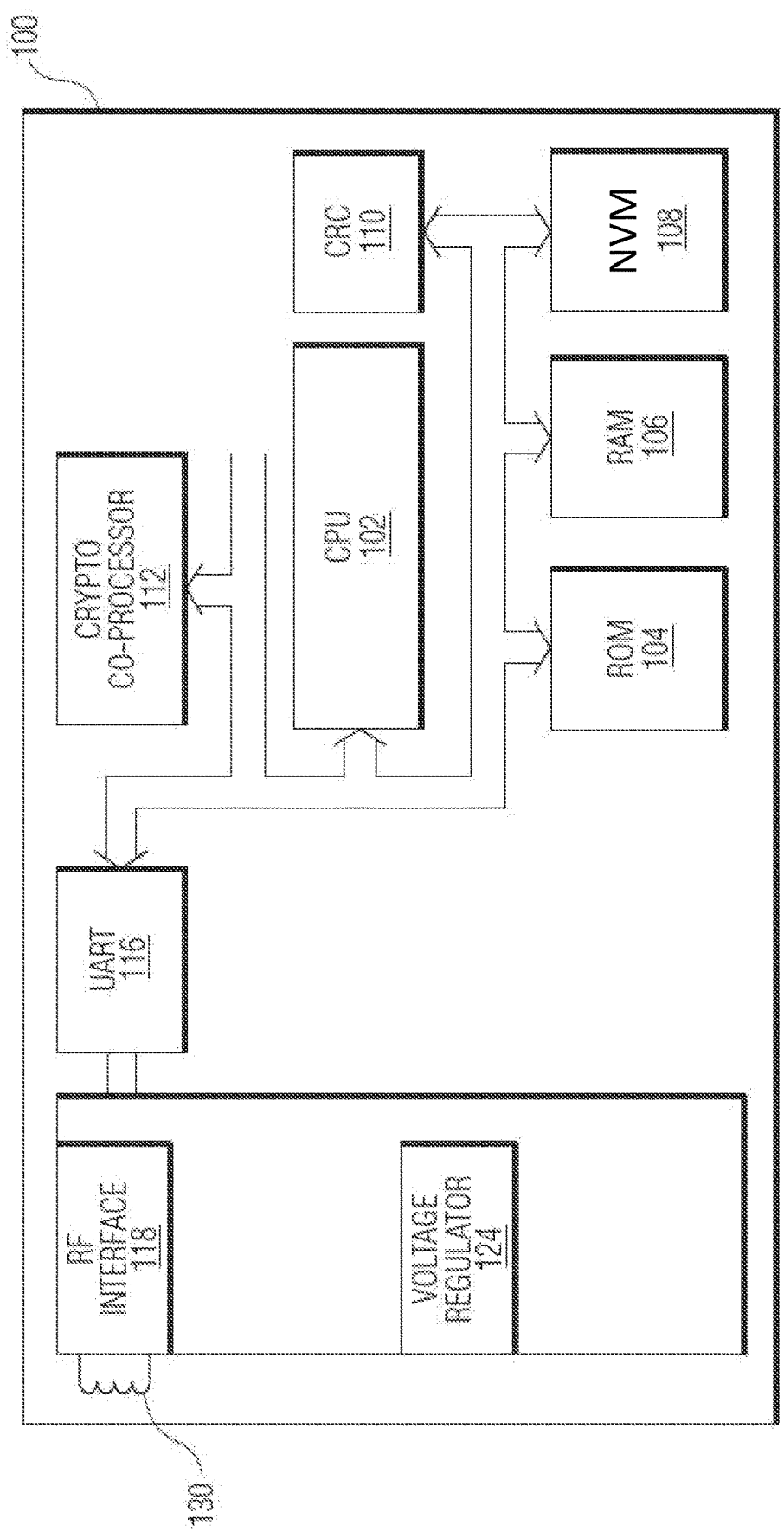
FIG. 1 is a block diagram depicting functional components of a contactless smart card.

It will be readily understood that the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

For simplicity, the described features, advantages, and characteristics of the invention are described throughout this specification may be described as being implemented within a smart card or other similar piece of electronic equipment, but could instead be implemented in other devices that utilize non-volatile memory to store and update information.

In a typical embodiment, aspects of the present invention may be implemented within a device including a processor or microcontroller and a memory device, such as a smart card device. FIG. 1 is a block diagram of contactless smart card 100. The smart card includes a CPU 102, and a memory subsystem that may include a read only memory (ROM) 104. Typically, CPU 102 can read from ROM 104, but is unable to write-to or otherwise modify data stored in ROM 104. ROM 104 may store software comprising a basic input-output system (BIOS) enabling hardware components of contactless smart card 100 to operate. The memory system of contactless smart card 100 includes random access memory (RAM) 106. CPU 102 is configured to store data into, modify data in, and retrieve data from RAM 106. RAM 106 may be a volatile memory system in that when contactless smart card 100 loses power, data stored in RAM 106 may be lost.

The memory system of contactless smart card 100 further includes non-volatile memory (NVM) 108. CPU 102 is configured to read data from and write data into NVM 108. Data written into NVM 108 is retained when contactless smart card 100 is power cycled. NVM 108 may be any suitable non-volatile memory technology, such as phase-change RAM and resistive RAM (RRAM). For example, resistive RAMs make use of the specific resistance of filaments contained within each memory cell; programming such a cell requires changing the resistance of the filament as an indicator of the cell's value. When a memory cell is produced but before it is programmed, the resistance of the filament(s) is, for all measurable purposes, approaching infinity. When the cell is first programmed (e.g., during testing or when persistent data is written to it), the resistance of the filament is changed—specifically, the resistance is lowered into a range that corresponds to a range of voltages or currents to be read from the memory cell.

In various embodiments, contactless smart card 100 includes a cyclic redundancy checker (CRC) 110 to assist in detection of errors in data retrieved from any of the memory subsystems, a crypto co-processor 112 to encrypt or decrypt data, and a Universal Asynchronous Receiver/Transmitter (UART) 116 that interfaces with an RF interface 118 for data transmission and reception, an RF antenna 130, and voltage regulator 124 to regulate electrical power supplied to the components of contactless smart card 100.

In other embodiments, the smart card device shown as contactless smart card 100 can be emulated by a computing device, such as a smart phone, or can be embedded in a larger device (e.g., a mobile phone or larger electronic device). Further, the invention contemplates physical or embedded security devices other than a smart card device such as contactless smart card 100, including but not limited to trusted platform modules (TPMs) and other forms of secure cryptoprocessors that utilize NVMs to store persistent, critical, and potentially secret data.

A memory system may be implemented by an array of memory cells, where each memory cell is configured to store a value. The memory cells may be implemented in any suitable manner, but may typically be configured as one or more logic gates configured in a "NAND" or "NOR" layout. Within the memory system, each memory cell includes a number of terminals enabling the memory cell to be programmed to a desired value or condition or to be read. Typically, the terminals include gate terminals for each memory cell. The gate terminals are typically coupled by rows to word select lines and the memory cells' drain terminals are coupled to column bitlines. Memory cells are programmed to a desired state by placing an electric charge on or removing an electric charge from the floating gate of a memory cell to put the cell into one of a number of stored states corresponding to different charge states of the memory cell. For example, a single memory cell can represent two binary states, e.g., 1 or 0, where the values are associated with different stored charges of the memory cell. If the stored charge is above the threshold, the memory cell is programmed to a first value or condition and if the stored charge is below the threshold, the memory cell is programmed to a second value or condition.

The reading of such memory cells can be accomplished by applying appropriate read voltages to a cell's control gate terminal and drain and comparing the drain to source current, which can indicate the voltage threshold (Vt) of the cell, against a reference current, e.g., a "trip point," to determine the state of the memory cell. In an example data read operation, 0 volts can be applied to a selected wordline, e.g., to the control terminal of a memory cell or memory cells in the selected wordline. A read pass voltage of about 5 volts can be applied to unselected wordlines, e.g., to the control gate terminals of memory cells in the unselected wordlines. The drain-to-source current, e.g., the "cell current," or "drain current," flowing through cells on the selected wordline, is then indicative of the binary logic state of or the value stored by the cell.

As such, when the cell current of a particular memory cell is above the trip point, the memory cell is read as having a first state associated with a first value. When the cell current of the particular memory cell is below the trip point, the memory cell is read as having a different state or value.

Figure 2:
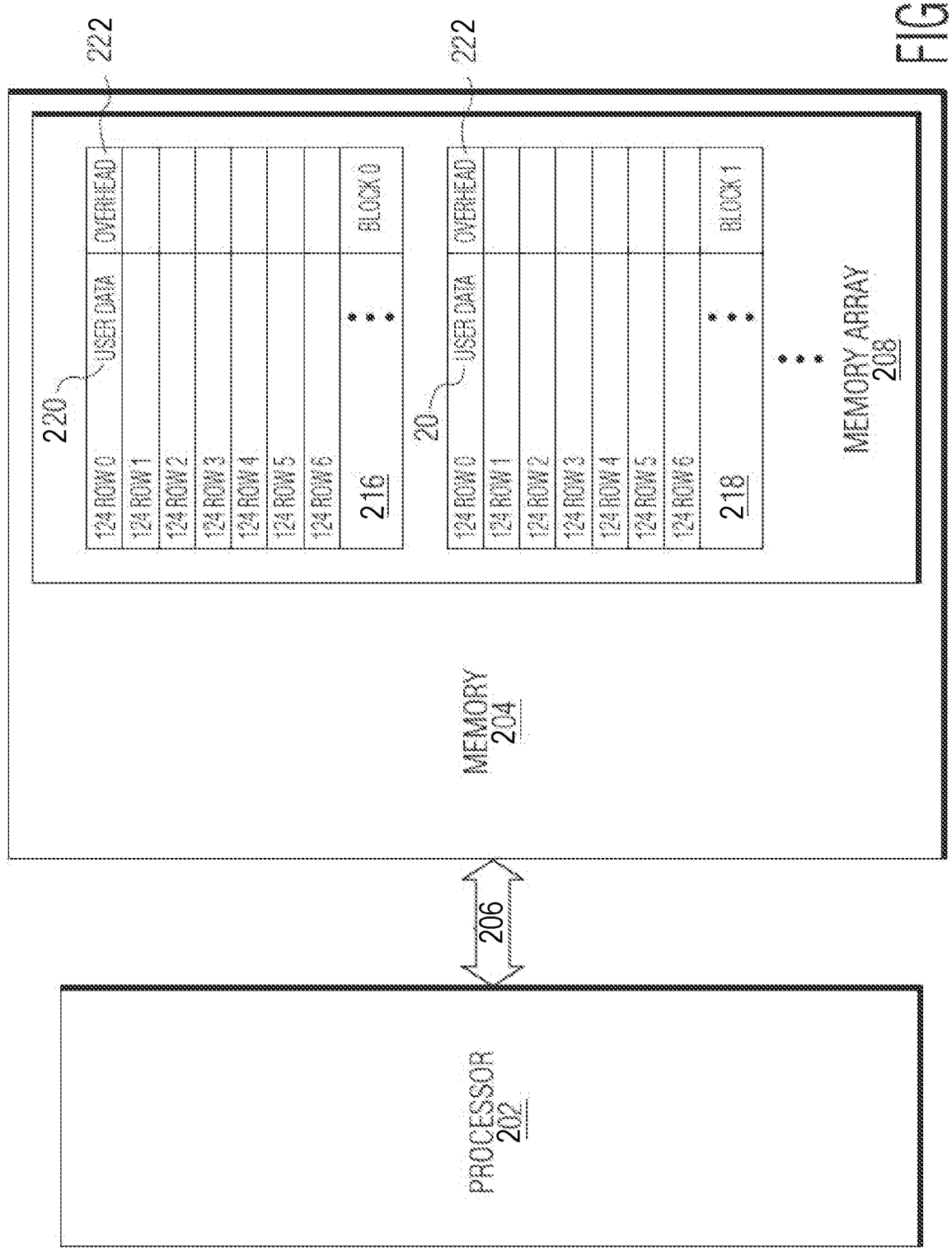
FIG. 2 is a block diagram depicting functional components of a memory system of a device such as the contactless smart card of FIG. 1.

To illustrate the operation of such memory, FIG. 2 is a block diagram of an electronic system 200 having a memory device 204 (e.g., memory system of contactless smart card 100 of FIG. 1) in accordance with an embodiment of the present disclosure. In the system 200, the memory device 204 is coupled to a processor 202 via an address/data bus 206.

The memory array 208 contains floating gate memory cells arranged in a sequence of memory blocks 216, 218. The blocks 216, 218 contain a series of physical pages/rows (shown as "Row 0," "Row 1," etc.), each page containing one or more logical sectors (shown here for illustration purposes as a single logical sector per physical page/row) that contain a user data space sector 220 and a control/overhead data space 222 (shown as "OVERHEAD"). The overhead data space 222 contains overhead information for operation of the sector 220, such as an error correction code (ECC), status flags, or an erase block management data field area (not shown).

Figure 3:
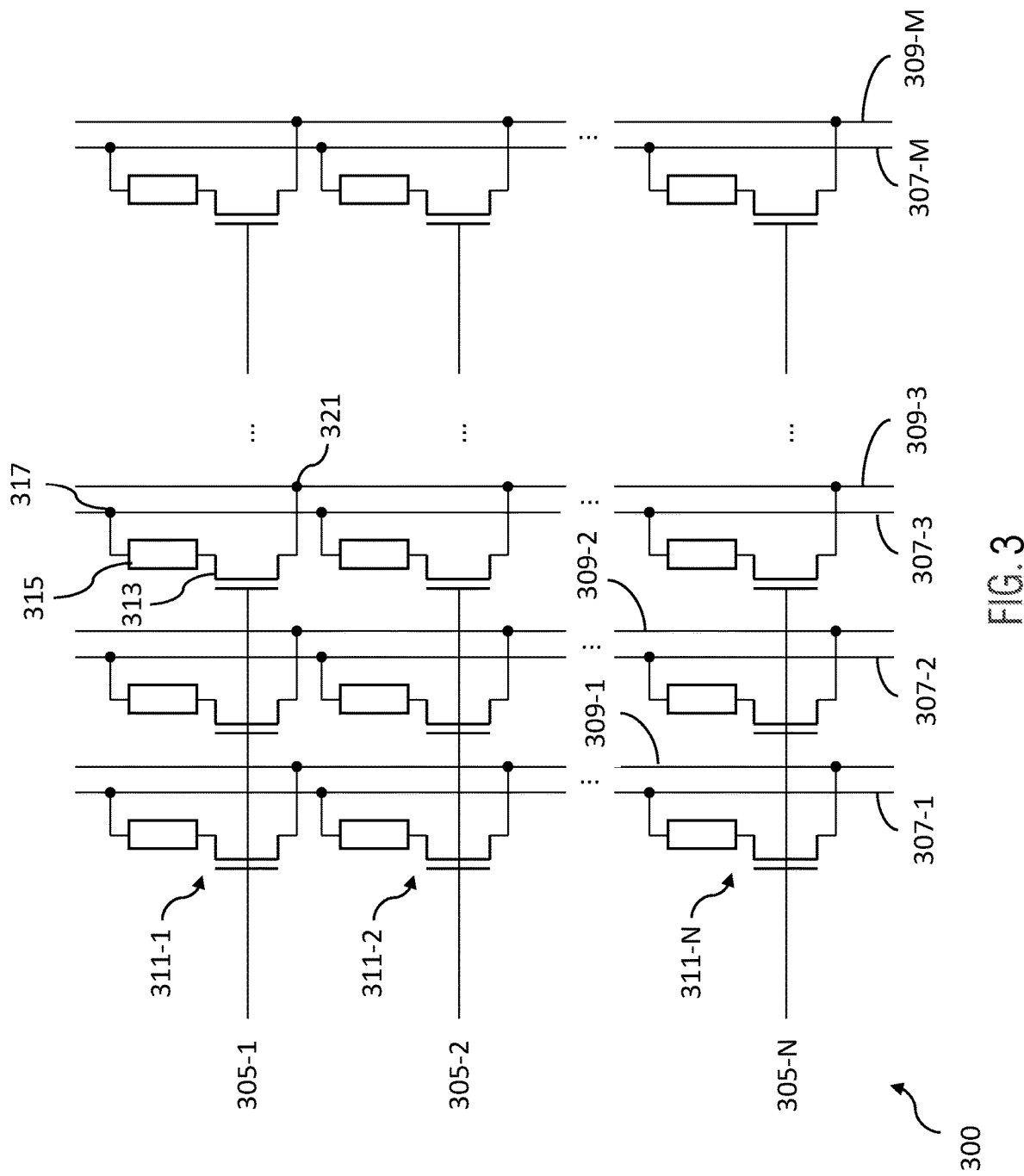
FIG. 3 is a circuit diagram depicting a portion of a resistive random-access memory (RRAM) array that may form part of the memory of FIG. 2.

FIG. 3 is a schematic illustrating a portion of a resistive RAM (RRAM) array 300 that may form part of memory array 208 of FIG. 2. As shown in FIG. 3, memory array 300 includes wordlines 305-1, . . . , 305-N and intersecting bitlines 307-1, . . . , 307-M and load lines 309-1, . . . , 309-M. Memory array 300 includes non-volatile memory cells 311-1, . . . , 311-N, each located at an intersection of a wordline 305-1, . . . , 305-N with a local bitline 307-1, . . . , 307-M and a local load line 309-1, . . . , 309-M. The non-volatile memory cells 311-1, . . . , 311-N may have any suitable architecture for RRAM cells; in the illustrated example, a memory cell includes a cell select gate 313 (e.g., a field-effect transistor (FET)) and a memristor 315 or similar storage device electrically connected to the cell select gate 313. The memory cell connects on the gate 313 side to the local load line 309-1, . . . , M at a source contact 321, and on the memristor 315 side to the local bitline 307-1, . . . , M at a drain contact 317.

As shown in the embodiment illustrated in FIG. 3, a wordline 305-1, . . . , 305-N is used to select a row of cells, and a bitline 307-1, . . . , 307-M is used to select a column of cells, so that a single cell 311-N is selected for reading/writing. A switchable drain current load is applied to the load lines 309-1, . . . 309-M. To perform a read or write operation on a memory cell 311-N, the selected/active bitline 307-1 is discharged to 0 V, and then the active wordline 305-N and the corresponding load line 309-1 are enabled for a fixed, predefined time. Under these conditions, the voltage threshold (Vt) and/or drain current (cell current), which is indicative of the binary state of the memory cell 311-1, can be determined, e.g., whether the drain current is above or below the trip point.

When a memory cell has been programmed to a particular value or condition (e.g., a voltage, current, or resistance value)—such as "set" or "cleared" (or "reset")—the memory cell may have a value that is close to the threshold value that delineates a set or cleared state for the cell. This can affect the accuracy of a memory cell read operation. Because this process typically requires the conversion of an analog value (e.g., a difference between the charge or voltage measured on a memory cell's floating gate and a threshold value, a difference between the current flow measured through a memory cell and a threshold current value, or a difference between a resistance of a component of the memory cell and a threshold resistance value) errors in the original analog memory cell measurement read operations can occur. If the measured analog values are close to the threshold values that delineate the memory cell being designated as cleared or set, there is a risk that during the analog read operation and the resulting analog error could lead to the memory cell being read incorrectly.

Furthermore, the composition of physical materials in some NVMs provides for memory cells that have never had data written to them—referred to as "virgin" memory cells in this disclosure—to exhibit different electrical characteristics than memory cells that have been programmed toward a "set" or "cleared" state at least once. For example, a resistive RAM cell that has been written with a logic zero or a logic one will conduct current when subject to a biasing condition; such a conductive memory cell is referred to herein as a "formed" memory cell. In contrast, a virgin resistive RAM cell conducts virtually no current; another term for "virgin" used herein is "unformed," to differentiate these cells from formed cells.

Testing for unformed memory cells may allow a determination as to whether or not a device's NVM has been tested post-production. The distinction of virgin devices which need full access during test from already tested devices which potentially contain secret information and must get blocked against non-permitted accesses, is a problem which normally gets tackled by writing specific data to specific locations of the memory—a standard practice of a locking mechanism. If any other pattern is read (e.g. due to an attack) this locking is non-effective. Hence, the security level of such a locking mechanism must be considered as rather low.

The present disclosure is directed at test devices and methods that can distinguish tested/active NVM devices from untested devices by directly detecting the formed/unformed state of memory cells. During the boot process or before providing access to a testing interface, a test module enables one or more selected memory cells and then measures, for each cell, an electrical property that has clearly different values before and after forming of the cell. For example, an unformed RRAM cell has extremely high resistance, which the test module measures either directly or by measurement of conductivity under a special biasing condition.

Thus, when booting, a device might check if a memory location is still virgin or already formed. If virgin, the device allows test access (read/write of any memory location). If the checked location is already formed, the device will enter a different state ("mission mode" or "user mode"), in which a direct access to the memory isn't possible anymore. The device may contain an indicator or switch which distinguishes the two cases—virgin vs. already tested/device is in user mode. When booting the chip, or when trying to enter test mode, the device might grant access to memory areas which need to be protected from becoming public, the switch must get checked for its state. The testing module may write the state of the switch to the device based on the outcome of the virgin check.

An attacker may attempt to manipulate this virgin check to make a device in mission mode appear to the testing module to be not yet tested (still virgin). By this, access to the test interface or to secret data stored in the NVM might get unprotected. The following examples illustrate the need for a security hardening of the virgin check. One potential security threat of such a check is related to the fact that the formation state of the memory cells is checked with a dedicated biasing condition that may not be especially protected itself. As an example, formed RRAM bit cells might drain a current of 30 to 40 µA for one logic state (e.g. logic 1) and 10 to 20 µA for the other (logic 0). The logic state can get discriminated by comparing the cell current against 25 µA. In contrast, unformed RRAM bit cells conduct virtually no current. Hence, an easy approach to distinguish a virgin device from a formed one, could be to read any memory location against using a reference of 5 µA instead of 25 µA. All formed cells will appear as logic 1s, as these conduct more current than the reference, while unformed cells will appear as logic 0s. If an attacker is able to detune the reference to e.g. 50 μA while the virgin check is being executed, all formed cells would appear as logic 0s as these are now below the actual (detuned) reference current. Hence, the check would conclude that the device is still virgin although all cells are already formed.

Consequently, the invention includes a security hardening procedure to ensure that an attacker who is potentially able to manipulate the biasing condition by any means (supply condition including glitch attacks, light attacks, etc.), is not able to do this without being noticed.

NVMs are frequently using changed biases in the read circuitry to ensure sufficient margins of the cells after writing (by moving the threshold more towards the expected cell conditions for logic 0's or 1's). This is e.g. done in repetitive write algorithms, which start with weaker write conditions to avoid disturbances and repeat write operations with stronger conditions only, if the resulting cell condition is too close to the normal threshold and may result in read instabilities if no further action is taken. This process is referred to as margin-checking. The security hardening described within this document proposes to apply the method of margin checks which are normally only needed on prepared cells to unformed cells, to achieve a sanity check. This invention proposes a way of using one more special biasing condition to check, if the virgin-check is able to identify the prepared memory condition without the necessity of the memory being actually formed. This extra condition could be called a sanity check of the virgin-check. As an attacker might be able to precisely time the attack, the virgin-check and the sanity check can get executed repeatedly in a random order to further increase the protection level.

Therefore, as described herein, the present disclosure provides a system configured to execute a virgin memory check on a NVM to determine whether the NVM has been tested. A testing module in accordance with the disclosure applies a bias condition to one or more memory cells to read an electrical property of the cell that will indicate whether the cell is formed or unformed. The system is further configured to implement one or more security hardening methods that detect whether the virgin check has been compromised by an attacker.

Figure 4A:
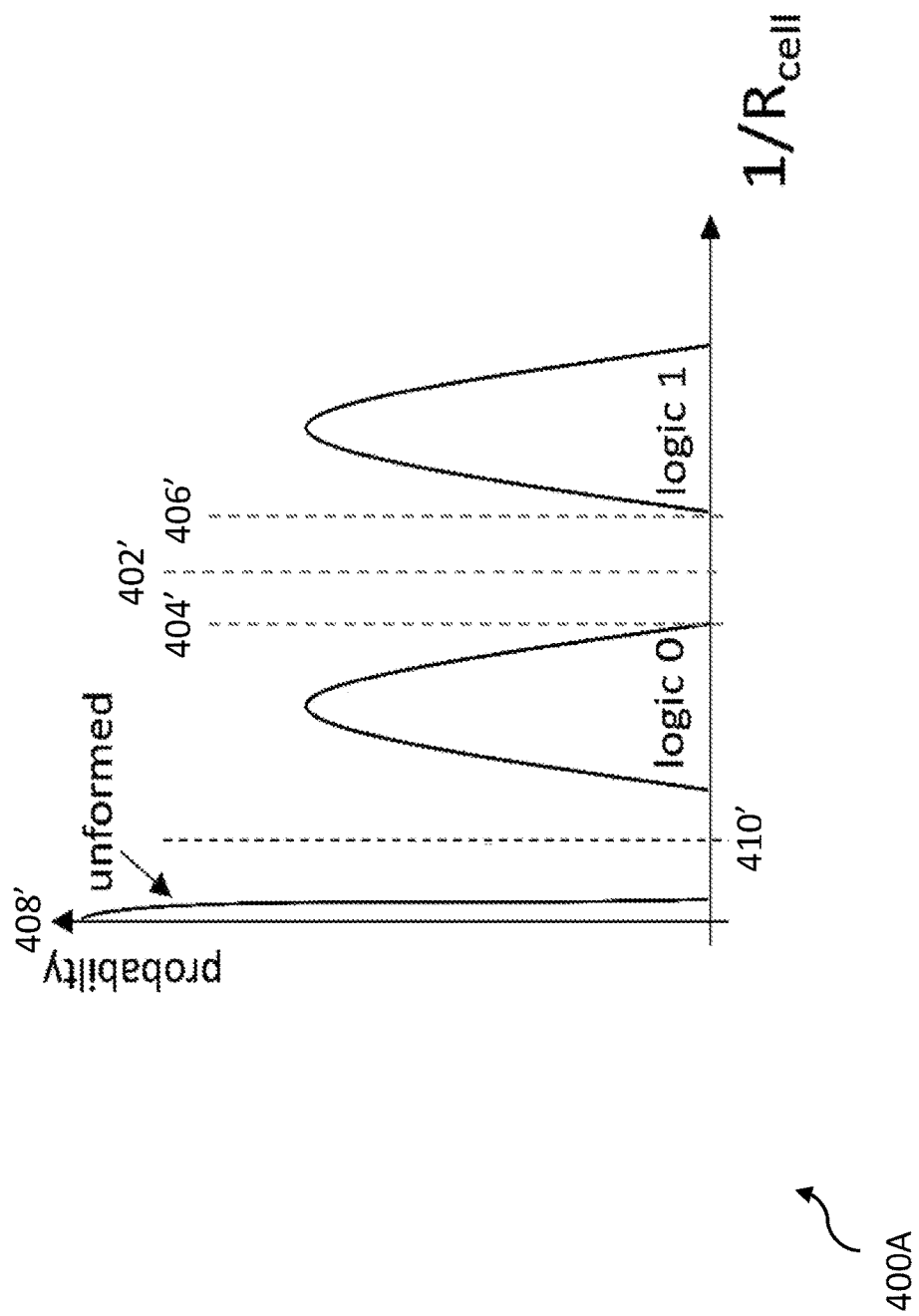
FIG. 4A is a chart depicting the probability that a measured resistance of a memory cell will fall within given ranges, depending on whether the memory cell has been formed and data has been written to it.

Memory read accesses typically apply a specific bias condition and check if the accessed memory cell(s) has/have a property which is either below or above a certain threshold. This is depicted in FIG. 4A for the case where the cells are being checked against a reference current level. In the chart 400, threshold 402' represents the normal read condition associated with the reference current. A high (low) resistance of the cell causes a current which is smaller (larger) than the reference current; the cell's read current can get interpreted as a logic 0 (1), as shown by the probability curves arising below (above) the threshold 402'. The resistance itself for the 2 logic states typically covers a reasonable range leading to distribution as indicated in FIG. 4A. The chart 400 also depicts a low margin threshold 404' and a high margin threshold 406' that represent the "cleared" and "set" margin read conditions. These thresholds are enabled by decreasing (increasing) the reference current for the margin read condition, as described further below.

The chart 400 also illustrates a probability curve for unformed cells. Unformed cells have such a high resistance that the cell's read current can be considered to approach zero, which is represented in the chart 400 by minimum threshold 408'. In the depicted scenario, unformed cells will always be read as logic 0s in both normal reads and margin reads. Consequently, a normal read does not allow to conclude if the cells are still unformed or already prepared for the normal use and just in the logic-0 condition. The present disclosure provides for an additional virgin threshold 410', at which a cell current read would result in a logic 0 for unformed cells and a logic 1 for formed cells, respectively. The associated modified (here, reduced) reference current can allow a distinction of unformed cells from formed cells in any logic state. It will be understood that even if the distribution for logic 0s would extend towards very low currents, a virgin check can be done if the conclusion is based on a probabilistic approach—an unformed memory will show a current which is lower than the threshold 410' for all cells which get challenged, while in a sufficiently large population of formed memory cells, there will be a countable number of cells that are above the threshold 410'.

Figure 4B:
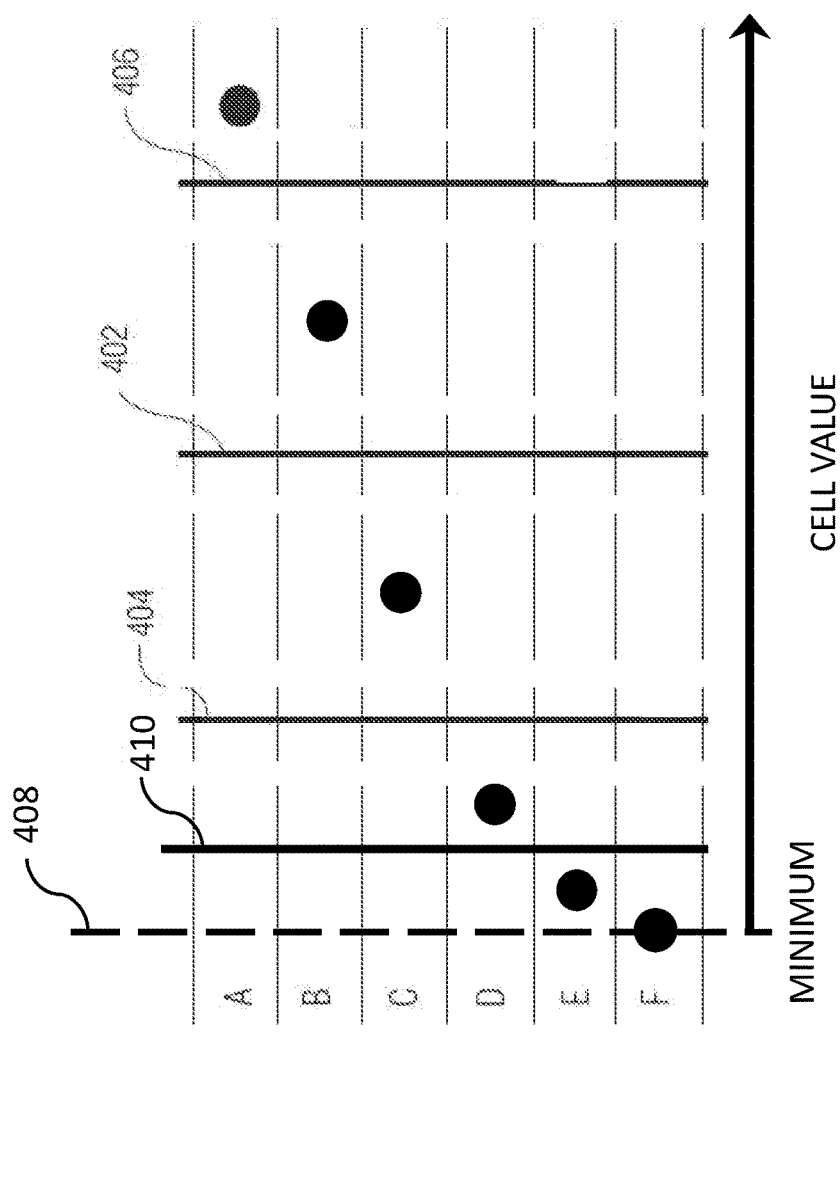
FIG. 4B is a chart depicting example analog values of a memory cell relative to measurement thresholds.

To illustrate these complexities, FIG. 4B is a chart 400B illustrating example analog signal values (e.g., gate voltage, drain current, resistance values) of a memory cell and how those signal values compare to the cell's signal value thresholds. Specifically, FIG. 4B depicts several examples A-F. For each example, the horizontal axis represents the memory cell's analog value and the vertical lines represent threshold values for determining that the memory cell is in a particular state. For the normal read threshold 402, f the cell's analog value, represented by the black circles in each example A-F, is less than threshold 402, the cell is read as being cleared (e.g., has a value of '0'). If the analog value is greater than threshold 402, the cell is read as being set (e.g., has a value of '1'). Further, if the memory cell's value falls below (to the left of) reset margin threshold 404, for example, the system can determine with high confidence that the memory cell is cleared and can designate that memory cell a value of 0. Similarly, if the memory cell's value is above (to the right of) set margin threshold 406, the system can determine with high confidence that the memory cell is set and can designate that memory cell a value of 1.

In order to compare the memory cell's value to either margin 404 or 406, the system is configured to perform a read operation on the memory cell to compare the value of the memory cell to one of the margin 404, 406 values. This process is referred to as performing margin checks on the value of a particular memory cell. Typically, a memory system can use the margin checks to identify memory cells that are weakly programmed and, based upon identifying such a memory cell may initiate strengthening of the memory cell's value.

The present invention extends the applicability of margin checks to the task of distinguishing between formed and unformed cells. As described above, an unformed cell's value will be at or near the threshold minimum 408, indicative of, e.g., zero read current or infinite resistance. In the normal and reset-margin read operations, the unformed cell is read as being cleared because its value is below the corresponding thresholds 402, 404. The virgin check of the present disclosure includes an additional read operating using a suitably low (as described further below) reference current to establish a virgin threshold 410. The memory cells of examples D, E, and F illustrate different cases of measuring against the virgin threshold 410. In example D, the cell value falling below the reset-margin threshold 404 and above the virgin threshold 410 would cause the cell to be designated as "formed" with respect to the virgin-check, and the memory cell would be designated as storing a logic 0; the memory cells of examples E and F fall below the virgin threshold 410 and would be designated as "virgin" or "unformed."

Figure 5:
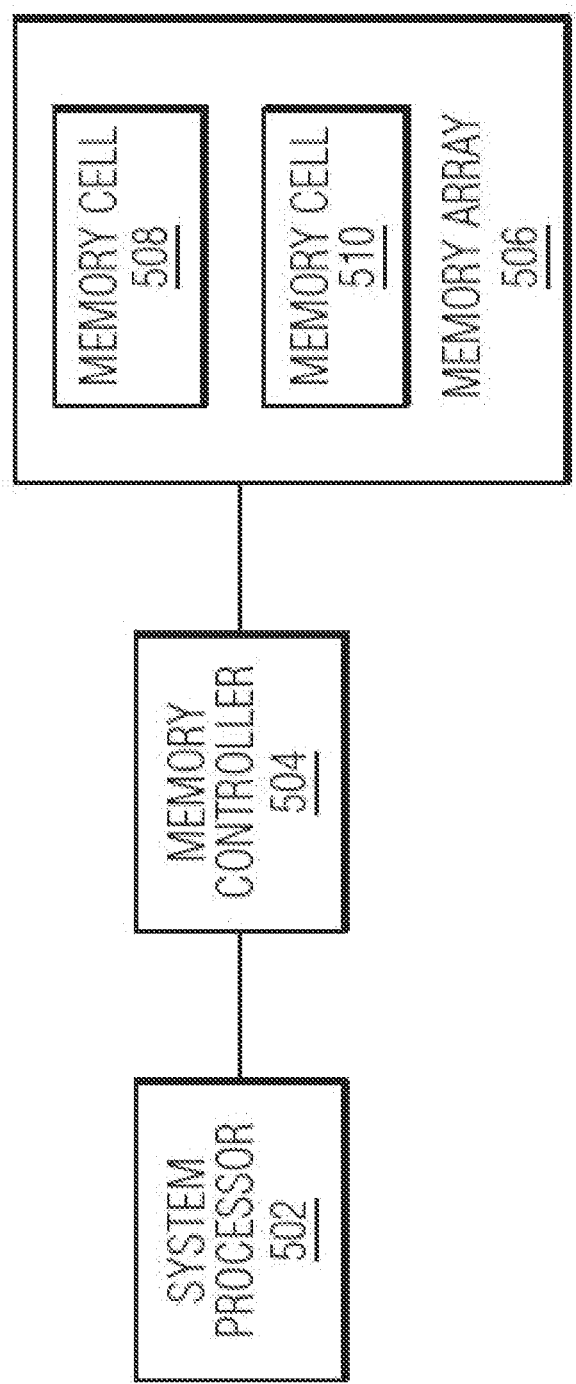
FIG. 5 is a block diagram showing functional components of a memory system in accordance with the present disclosure.

In the present system, a testing module for NVM arrays in a device die may be implemented using internal or external components of the device. FIG. 5 is a block diagram showing functional components of the present security-hardened virgin die check implementation. System processor 502 (e.g., CPU 102 of FIG. 1 or processor 202 of FIG. 2) accesses and modifies stored information through memory controller 504. Memory controller 504 is configured to access memory array 506 (e.g., one of ROM 104, RAM 106, flash memory 108 of FIG. 1 or memory array 208 of FIG. 2) to retrieve data therefrom or write data thereto. Specifically, memory controller 504 is configured to access values stored in a number of memory cells contained within memory array 506. Each memory cell in memory array 506 may be configured in accordance with the individual memory cells memory blocks 216 or memory blocks 218 of FIG. 2 or, specifically, the individual memory cells 311-1, . . . , 311-N of FIG. 3.

With reference to FIG. 5, only two memory cells 508 and 510 are shown, even though memory array 506 may contain many more individual memory cells. The two memory cells 508 and 510 may be considered to represent tested or untested memory cells in a NVM that is subject to the present testing procedures. For example, a first memory cell 508 may have been formed and may store secret data as described above. The memory controller 504 or system processor 502 may cooperate to perform the virgin check and the security check on either or both of the memory cells 508, 510 in accordance with the procedures described herein; for the above example where the memory cell 508 contains secret data, the memory controller 504 or system processor 502 performing the virgin check should determine that the NVM being tested is not a virgin die. In some embodiments, a memory cell 508 may receive a write operation during the testing procedure, either to record part of a test pattern or to store a flag indicating whether the NVM has been tested.

The result of the virgin check is subject to verification—a die that passes the virgin check must also pass the security check before the memory array 506 is assigned a "virgin" status. A potential attack scenario is the following—if the hacker is able to disturb the read circuitry in a way that would let all cells (irrespectively of their state of formation and actual logic value) appear in the logic-0 state, the virgin check may conclude that none of the cells is formed yet. For example, the critical read threshold(s) may be disturbed in a way which corresponds to a current which is even higher than all cells containing a logic 1. Further attack scenarios to the read circuitry are to be considered, e.g. an attack to the data outputs of the memory getting logically masked might also result in a false-pass result of the virgin check.

Consequently, the testing module performs the security check to ensure the virgin-check is not under attack. Preferably, for best coverage and least detectability (of virgin check vs. security check), such a security check may be as similar as possible to the virgin check. In some embodiments, the read circuit of the testing module may incorporate both the active bitline of the memory cell being read, and a reference bitline associated with an inactive memory cell or memory array. This allows for leakage compensation and/or matching of parasitic resistances and capacitances; the testing module may compare the properties of the cell being read, which is connected to an active bitline, to another (reference) bitline that has the same parasitics but does not select an actual cell. In some embodiments, the reference bitline may be loaded by the reference current. The testing module may include a sense amplifier connected to the active and reference bitlines; the sense amplifier may check if the active bitline with the memory cell of interest (i.e., selected memory cell) conducts more or less current than the reference bitline. That is, the testing module compares I_cell vs. I_nocell+I_reference.

Figure 6:
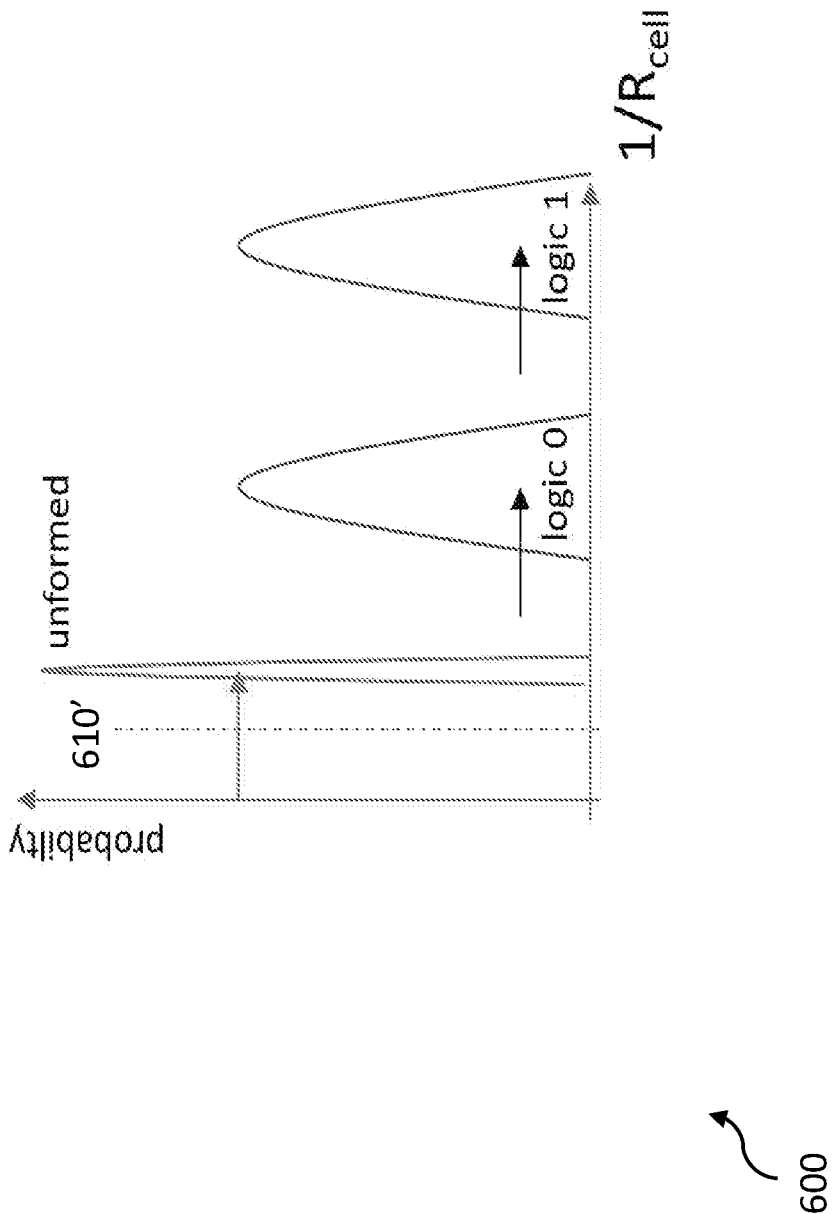
FIG. 6 is a chart depicting a shift, relative to FIG. 4A, of the probability that a measured resistance of a memory cell will fall within given ranges, the shift occurring during a secure memory test in accordance with an example embodiment of this disclosure.

In some embodiments, this can be done by causing intentionally a condition in the circuit which results in logic 1s being read from all the memory cells, even unformed cells. In one example implementation, the testing module may apply an active load current that is then drained in parallel to the selected memory cell. The threshold current remains the same as for the virgin check, but due to the additional current in parallel to the real bit cell which gets drained by a dedicated circuit, the cell appears to be more conductive than it actually is. This implementation effectively amounts to performing a margin check, as is done for margins of normally written cells, instead for the virgin read threshold. Referring to FIG. 6, a chart 600 illustrates the effect of this parallel current drain on read current probabilities (as shown in FIG. 4A): the virgin threshold 610' remains consistent with threshold 410' of FIG. 4A but, as indicated by the 3 arrows pointing to the right, all cell currents appear higher than normal due to the added offset current. This could get translated into a negative reference current. In some embodiments, the offset current may be approximately twice the reference current (assuming unformed cells are conducting no measurable current) to achieve a similar read accuracy. The testing module in this embodiment may therefore compare I_cell+I_offset vs. I_nocell+I_reference (with I_offset~2× I_reference).

Figure 7:
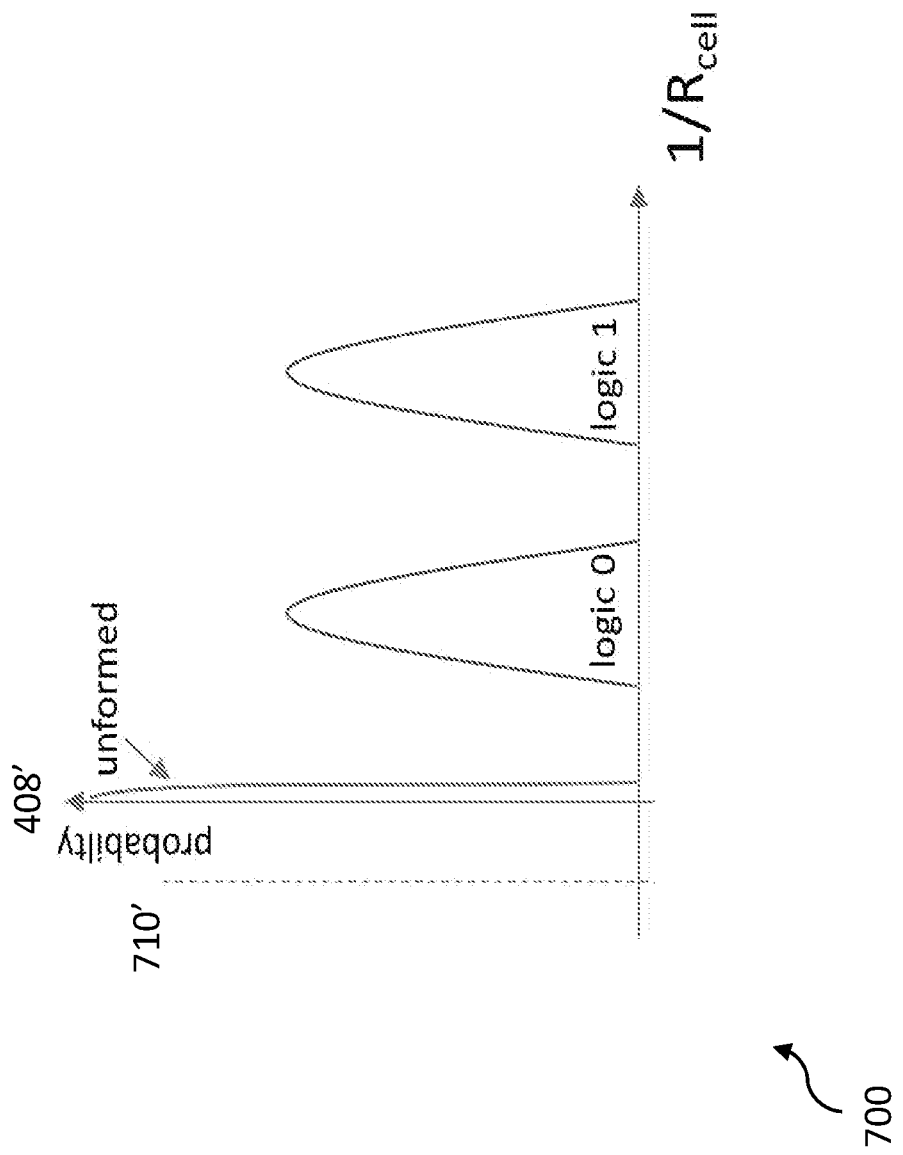
FIG. 7 is a chart depicting a shift, relative to FIG. 4A, of a measured resistance threshold for a secure memory test in accordance with another example embodiment of this disclosure.

Referring to FIG. 7, in another embodiment to let unformed cells appear as a logic 1, the read current may be read against a threshold 710' that represents a "virtually negative" reference current. Thus, in the chart 700, the probability curves for logic 0, logic 1, and unformed memory cells are in the same positions as in the chart 400A of FIG. 4A, but the security threshold 710' falls below (to the left of) the minimum threshold 408' associated with a read current of zero. In some embodiments, the testing module may achieve this "virtually negative" reference current by loading the active bitline instead of the reference bitline; by this, the testing module comparison becomes I_cell+I_reference vs. I_nocell (or I_cell vs. I_nocell−I_reference).

In accordance with some implementations, the approach of FIG. 7 provides some advantages over the approach of FIG. 6. First, it can be implemented with simpler circuitry, such as an analog multiplexer configured to load either the active or the reference bitline. This analog multiplexer allows for the reference bitline to be a normal bitline of a non-accessed memory array. The circuit modification in comparison to a non-security-hardened circuit is a minor modification.

Second, the approach of FIG. 7 may be less detectable by an attacker. Ideally, the current consumption of both checks is identical, as a hacker might sense the current consumption and derive valuable information for the attack. In the first approach, the current consumption might be different for the virgin-check and the security-check. It may require additional "artificial" current consumption to make the checks appear similar. In the second approach, the current consumption for both the virgin check and the security check is the same, as the current is drawn in either case, either through the reference or the sensed bitline.

Third, the second approach may have better performance. As changing references normally requires to wait until the reference has stabilized, a repeated random swapping of the virgin and security checks (as described further below)

would in the first approach require an adjustment of the biasing at every swap (actually every access, to avoid a signature of the swapping in the timing) causing multiple settlings and associated timing impact. In contrast, the second approach uses always the same bias condition and simply swaps the loaded bitline (active or reference).

Finally, the second approach more thoroughly covers the overall read circuitry—almost the full circuit is operated the same ways during the virgin-check and the security-check. By this, the vulnerability of the virgin die check to attack is minimized.

Figure 8:
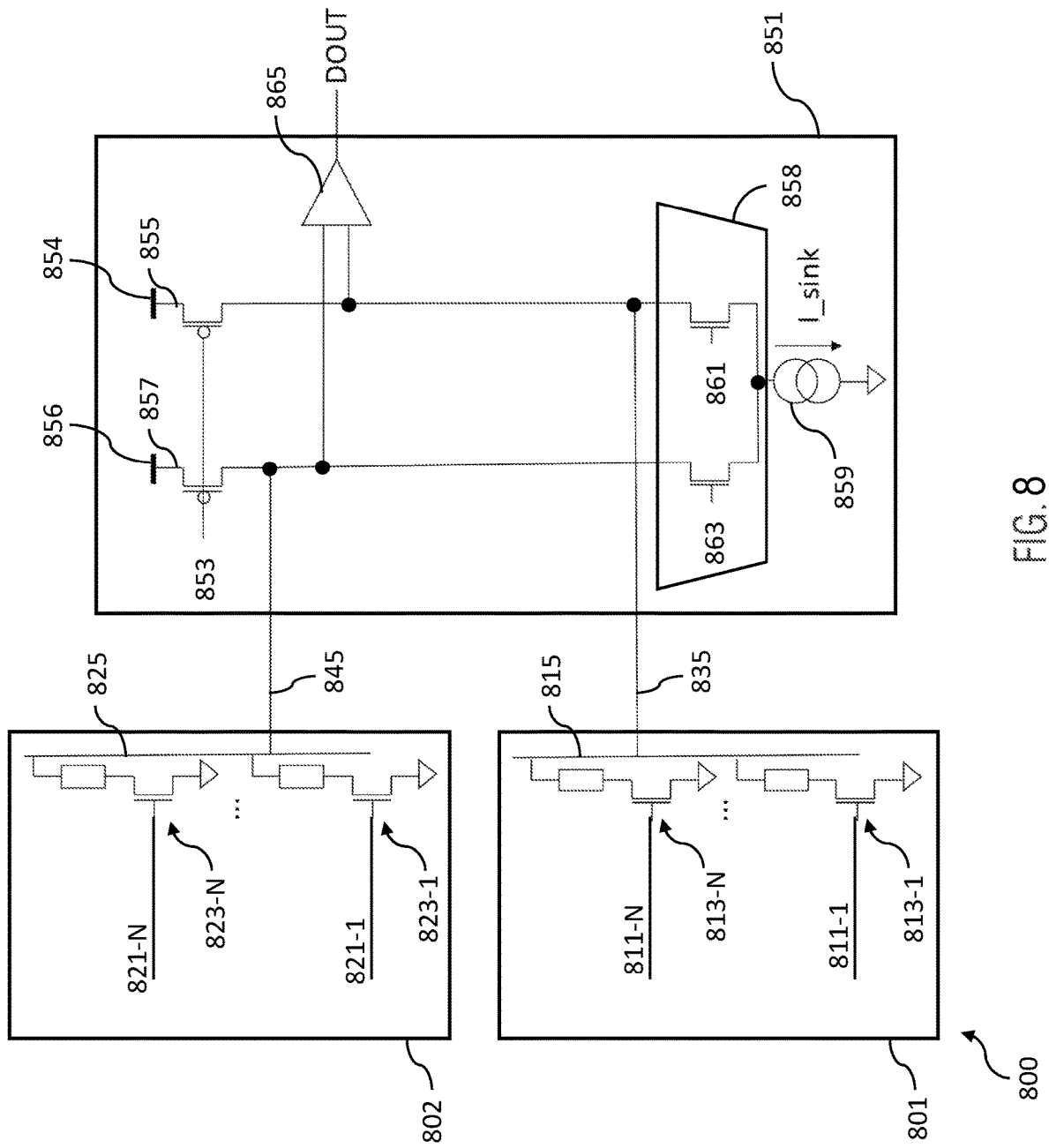
FIG. 8 is a circuit diagram depicting a memory array and a test circuit in accordance with this disclosure.

FIG. 8 illustrates an example embodiment of an electronic device 800 having an NVM subsystem as described above, comprised of a plurality of memory arrays that can be internally or externally tested for "virgin state" using the presently described methods. For purposes of simplified illustration, two memory arrays 801, 802 are shown. The memory arrays 801, 802 may be any suitable NVM technology, including but not limited to filament growth or ionic drift RRAM, phase-change memory. The example embodiment utilizes the fact that a virgin RRAM cell can be considered non-conductive; practically, it will be less conductive that any reasonable current sink used in a testing module. Further, in the example device 800, a pair of the memory arrays 801, 802 is used to take advantage of matching parasitic capacitances and resistances for the two arrays 801, 802. FIG. 8 presents an abbreviated diagram of each of the components of the example memory arrays 801, 802—reference is made to the operational description of memory cells, bitlines, wordlines, and arrays accompanying FIG. 3, above. For illustrative purposes, each memory array 801, 802 is shown with N wordlines 811-1 . . . N, 821-1 . . . N. Each array 801, 802 further has a plurality of bitlines, including a "selected" bitline 815, 825 that is the active bitline of each array 801, 802 addressed during the test procedure. N memory cells will be connected to each bitline of a memory array 801, 802 (including memory cells 813-1 . . . N connecting to selected bitline 815 and memory cells 823-1 . . . N connecting to selected bitline 825).

The device 800 may include a testing module 851 disposed on-chip with the memory arrays 801, 802 or otherwise internal to the NVM device and approximate the memory cell array(s) being tested. In some embodiments, the testing module 851 may be, or may include, one or more sense amplifiers that form part of the memory cell array. The testing module 851 may additionally or alternatively comprise hardware of the memory system, e.g., within system processor 502 or memory controller 504 as described above with respect to FIG. 5. The testing module 851 electrically connects to the corresponding bitline that is the selected (i.e., addressed) bitline 815, 825 of each array 801, 802 using any conductor or conductive path suitable for energizing the selected bitlines 815, 825; these connections are illustrated and referred to herein as "energized" bitlines 835, 845 because they are energized at least during the test procedure. A first energized bitline 835 connects to the selected bitline 815 of the first memory array 801—as described in the example below, the first array 801 is the "unselected" or non-accessed memory array and the first energized bitline 835 is the "reference" bitline. Similarly, a second energized bitline 845, connecting to the selected bitline 825 of the "target" or accessed memory array 802 is the "active" bitline. The functions of the energized bitlines 835, 845 may be swapped, as described below, to swap the "unselected" and "target" roles of the memory arrays 801, 802 and test the memory cells of both arrays 801, 802.

The testing module 851 may include components implementing a precharge stage, a loading stage, and a read stage that cooperate to perform the virgin and security checks on selected memory cells. The precharge stage may include one or more voltage sources 854, 856 each electrically connected to a PMOS transistor 855, 857 or other suitable switch for connecting and disconnecting the voltage sources 854, 856 to/from the energized bitlines 835, 845. A precharge signal source 853 connects to the transistors 855, 857 to enable and disable the transistors 855, 857.

A loading stage may include a current sink 859 switchably connected to the first energized bitline 835 and/or the second energized bitline 845. The current sink 859 may be a component of the testing module 851, or the current sink 859 may be a current sink already disposed within the device 800 for other purposes—that is, the testing module 851 does not require the addition of a unique or dedicated current sink, but may electrically connect to a trimmable current sink (e.g., used to perform normal read operations or margin reads on formed cells as described above). In some embodiments, the current sink 859 may be electrically connected to an output of an analog multiplexer 858 that receives the energized bitlines 835, 845 as inputs. The multiplexer 858 may comprise switching logic for enabling a first load 861 to connect the current sink 859 to the first energized bitline 835, and for enabling a second load 863 to connect the current sink 859 to the second energized bitline 845. The switching logic, or other selection logic of (or for) the test circuit 851, determines which of the loads 861, 863 to enable, based on which of the energized bitlines 835, 845 is the active/reference bitline and whether the virgin check or security check is being run, as described below.

According to various embodiments, the device 800 may implement a hardened virgin memory check by performing both a virgin memory check and a security check. A read stage of the testing module 851 may include a sense amplifier, such as an analog comparator 865, that connects to the first energized bitline 835 and the second energized bitline 845 as inputs and produces a digital output representing the result of the virgin check and/or the security check.

Figure 9B:
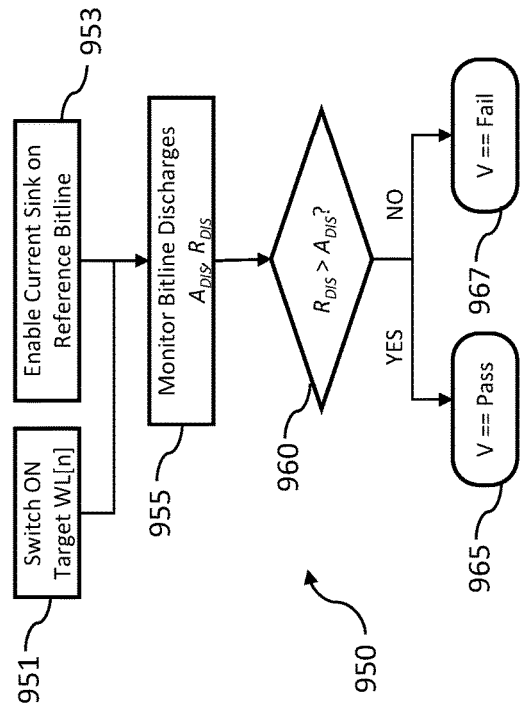
FIG. 9B is a flowchart depicting another part of an example method for determining the virginity of a memory cell using the test circuit of FIG. 8.
Figure 9C:
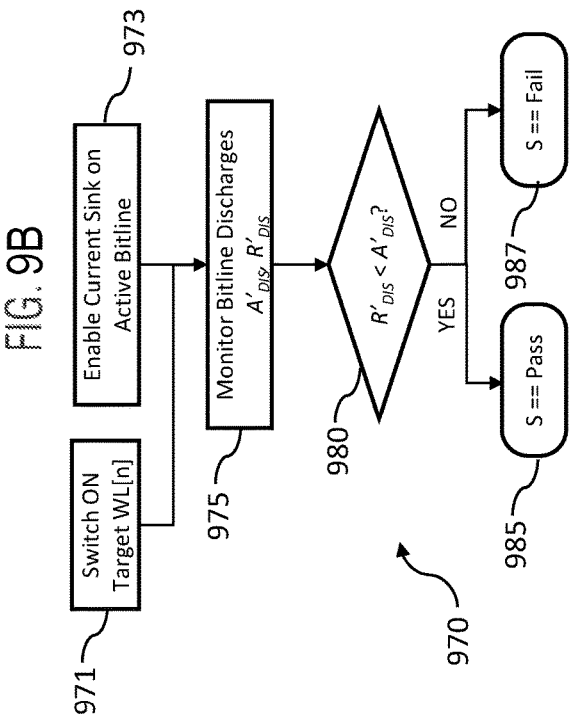
FIG. 9C is a flowchart depicting part of an example method for validating a test for virginity of a memory cell using the test circuit of FIG. 8.
Figure 9A:
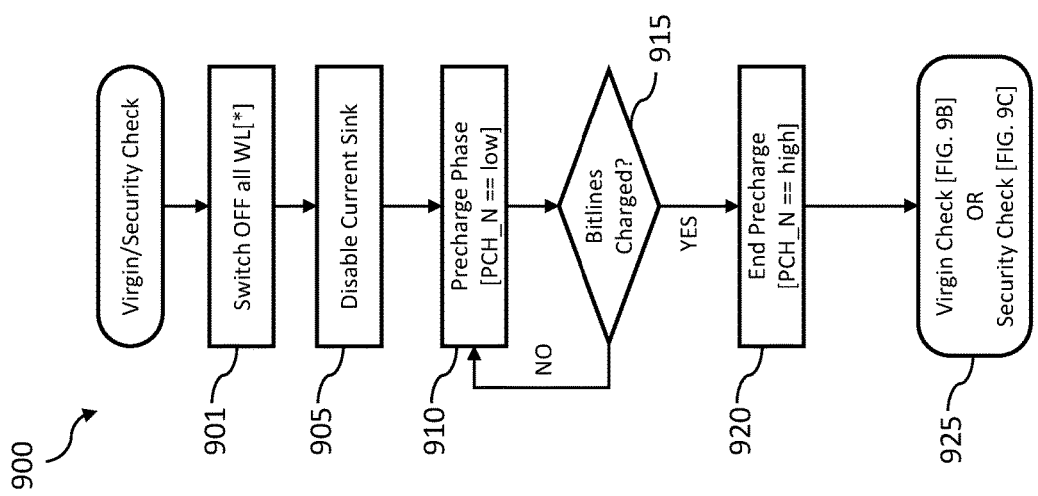
FIG. 9A is a flowchart depicting part of an example method for determining the virginity of a memory cell using the test circuit of FIG. 8.

FIGS. 9A, 9B, and 9C present an embodiment of the corresponding checks. FIG. 9A illustrates an example method 900 for preparing a testing module to test a selected memory cell using one or more read accesses. For the described example referencing the device 800 of FIG. 8, the target memory cell (i.e., the cell to be read) is the last memory cell 823-N of target wordline (WL[x]) is wordline 821-N, the active bitline is energized bitline 845, which applies a current or a voltage to the selected bitline 825 of the accessed memory array 802, and the reference bitline is energized bitline 835, connecting to a bitline of non-accessed memory array 801.

At 901, a read access will start with all wordlines (WL[*]) switched off. At 905, the testing module disables its current sink. For example, the testing module 851 may switch off both logic gates 861, 863 that can connect the current sink 859 to one of the bitlines 835, 845. At 910, the testing module may initiate a precharge phase to charge both energized bitlines 835, 845 of a pair to a defined starting voltage (here, for simplicity, to supply level). For example, the testing module 851 may push the precharge signal source low, enabling the PMOS transistors 855, 857 so the voltage sources 854, 856 are electrically connected to the respective bitlines 835, 845. At 915, the testing module may monitor for the precharge phase to complete. At 920 the testing module may end the precharge phase. For example, testing module 851 may drive the precharge signal source 853 high to disable the PMOS transistors 855, 857. At 925, selection logic of the test module will then determine whether to execute a virgin test (FIG. 9B) or a security test (FIG. 9C) on the memory cell, as described further below.

Referring to FIG. 9B, an example method 950 of performing a virgin check on a memory cell may begin once the active and reference bitlines are pre-charged, such as by using the method 900 described above. In parallel: at 951, the target wordline WL[x] is enabled, so that the target memory cell can sink current from the connected and precharged active bitline; and, at 953, the current sink is enabled on the reference bitline. Therefore, using FIG. 8 as an example, the target wordline 821-N of memory array 802 is enabled so that the value of the target memory cell 823-N is read on the active bitline 845; and, the current sink 859 conducting reference current "I_sink" will get connected to memory array 801 by enabling load 861. The testing module may, at 955, monitor the discharge of both the active bitline and the reference bitline to identify which input (bitline) discharges faster. For example, the testing module may include a sense amplifier (such as the analog comparator 865 of FIG. 8) that receives the active and reference bitlines as inputs; when the bitlines are precharged, both inputs to the sense amplifier are driven high, and as the target wordline and current sink are enabled, the input signals will drop as the current is drained.

If the target memory cell is formed, due to the change in its resistance (relative to unformed), the target memory cell will conduct more current than the current sink will drain, and correspondingly the active bitline will discharge faster than the reference bitline. If on the other hand the target memory cell is unformed, due to its very high resistance the memory cell will conduct less current than the current sink, and the reference bitline will discharge faster than the active bitline. At 960, the testing module may compare the rate of discharge of the two bitlines to determine if the reference bitline discharges faster than the active bitline. For example, the analog comparator or other sense amplifier may detect which input transitions to a low state first, and discretize the result into a logic 0 (if the reference bitline discharge $R_{DIS}$ is slower than the active bitline discharge $A_{DIS}$) or a logic 1 (if $R_{DIS}$ is faster) on the output line of the amplifier. Accordingly, the testing module may determine based on the comparison whether the virgin memory check passes (at 965) or fails (at 967) for the target memory cell.

In some embodiments, the precharge method 900 and virgin memory check 950 may be run on both memory arrays of a pair of memory arrays connected as in FIG. 8; that is, when reading a target cell in memory array 801, memory array 802 may serve as the reference. This may be achieved by simply swapping which of the loads 861, 863 is activated by the multiplexer 858. Additionally, the sense amplifier (e.g., the analog comparator 865) may invert the output DOUT or exchange the inputs (not shown in the drawing) to give consistent data depending on the cell conductivity, no matter to which array a read cell belongs. The load current (I_sink) may further be trimmable to allow for margin reads as described above.

In one embodiment, a "security check" to verify the accuracy/consistency of the virgin check may be implemented by loading the active bitline instead of the reference bitline. In the device 800 of FIG. 8, the target memory cell 823-N may drain current (if a formed cell is selected) or not (if a non-formed cell is selected). The security check shall test, if a potentially formed cell is distinguishable from a non-formed cell, so it shall check if a typical cell current of a formed cell (regardless which logical state it represents) is detectable. To achieve this independently of the actual cell state, the active bitline 845 may be connected with the current sink 859 while the reference bitline 835 may be disconnected from the current sink 859. In this configuration, the active bitline 845 will always drain more current than the non-loaded reference bitline 835. In some embodiments, connecting the current sink to the active bitline instead of the reference bitline only needs a simple modification of the circuit, e.g., in the selection logic to cause the analog multiplexer 858 to enable load 863 instead of load 861. Due to this minimum impact change, such a security-check read access will check the full sensing path in an almost identical setup as the normal read access reading a virgin cell. This achieves best coverage of all involved circuit elements and shows a negligible footprint, in terms of power consumption and of additional silicon area (and thus die cost).

Referring to FIG. 9C, an example method 970 of performing a security check—that is, a verification of the virgin check on a memory cell—may begin once the active and reference bitlines are pre-charged, such as by using the method 900 described above. In parallel: at 971, the target wordline WL[x] will get enabled, so that the connected memory cell can sink current from the connected and precharged active bitline; and, at 973, the current sink will also get enabled on the active bitline. The step 971 of enabling the target wordline WL[x] provides the advantage of maintaining an identical or nearly-identical power consumption during testing, whether the virgin check or the security check is being run. It will be understood however that enabling the target wordline WL[x] during the security check (step 971) is not required to execute the security check, and in some embodiments step 971 may be ignored or skipped. At 975, the testing module may monitor the discharge of both the active bitline and the reference bitline to identify which input (bitline) discharges faster. For example, the testing module may include a sense amplifier (such as the analog comparator 865 of FIG. 8) that receives the active and reference bitlines as inputs; when the bitlines are precharged, both inputs to the sense amplifier are driven high, and as the current sink is enabled and loads the active bitline 845, the corresponding input signals will drop as the current is drained.

The reference bitline is not connected to an active memory cell or to a current sink, so the active bitline will discharge faster and the test circuitry, if operating correctly, will output a result showing the selected memory cell is "formed." Only if the testing procedure is under attack will the security check produce a result that the cell is "unformed," thus revealing that an attack is underway. Consequently, when at 980 the testing module compares the rate of discharge to determine if the reference bitline discharges more slowly than the active bitline (i.e., if R'DIS is slower than A'DIS), the result should always be a logic 1, equivalent to "yes." If so, the testing module may determine that the security check passes (at 985). If however the result is a logic 0, equivalent to "no," it means the security check fails (at 987) and the virgin memory check 950 may therefore be compromised (i.e., by an attacker).

It should be noted that other types of memory cells may implement a margin read or virgin/security check function by applying other types of signals to the memory to perform a margin read. Such margin read signals may include particular voltages or currents that are applied to the memory cell to perform the margin read function. In those types of memory cells, such a signal may be referred to as the margin read signal, which may be adjusted to perform memory cell read operations at different margin values. For example, in some memory cells a margin read signal may comprise a particular voltage or current that is applied to a margin read terminal of the memory cell in order to read a value out of the memory at that particular margin level. The cell will be read as being in different states if the value (e.g., voltage, current, or resistance) of the memory cell falls above or below the value of the margin read signal. Consequently, as described in conjunction with the Figures and this description, references to gate bias voltages should be understood to be equivalent to other types of margin read signals. Additionally, references herein to a memory cell's gate terminal, should be understood to be equivalent to any type of memory cell's margin read terminal, which may include transistor gate terminals or any other memory cell input terminal suited for receiving a margin read signal for the memory cell. It should also be apparent that in various electronic systems that voltages and current signals are sometimes largely equivalent in that application of a signal comprising a voltage may require the generation of a corresponding current and application of a signal comprising a current may require the generation of a corresponding voltage.

Further, although the virgin memory checks and security checks described herein contemplate approaches for determining memory cell states by measuring current flow through memory cells based upon the application of a bias voltage and/or reference current, it should be understood that the checks could be utilized in conjunction with other types of memory cells in which other signals (e.g., voltage or charge stored in the memory cells, resistance values, and the like) are utilized to encode information into the memory cell. As such, the present approach may be utilized in any memory system application in which memory cells are configured to generate output signals that are indicative of the cell's value where the output signal is compared to one or more threshold signal values to determine whether the cell is cleared, set, or has another value.

As stated above, the main security threat of the virgin-die check is that a testing module might falsely conclude that the device is virgin although it isn't. This may happen if the virgin check itself gets attacked while it is performed, such as when starting a previously-tested and/or "user mode" device. The expected data is all-0 on a virgin device and NOT all-0 on a tested/in-use device. If an attacker is able to manipulate a read access in a way which turns the data to become all-0 although the actual data is non-zero, the false conclusion would happen. Embodiments described above for the security check are therefore used to confirm that the all-0 result is a valid outcome for the device being tested.

However, the boot process is normally a well-defined, ordered sequence of actions. If an attacker knows when in the boot sequence the virgin check is being done, it simplifies an attack on the virgin check to get access granted. This could be achieved by some means (like light exposure of sub-circuits with a laser) which may change the biasing of the read circuitry, e.g., the amount of the sink current. The security check as described previously which reads with a virtually negative read current can protect against such attacks, if these are not precisely timed. Even so, as both reads (virgin check and security check) may happen sequentially, and as an attack device (e.g., laser diodes) can be controlled precisely in time, a hacker might be able to attack only the relevant one of the two read accesses.

The present disclosure provides further means to protect the device. First, a random order of the two read accesses (i.e., whether the virgin check or security check is executed first) may reduce the chance of successful attack on the relevant check by a factor of 2, as the hacker can only guess which is the read access which needs to get attacked while the other access must not be attacked. Next, by doing numerous repetitive tests, the attack can become practically impossible—the success rate scales with $(1/2)^n$ assuming n pairs of accesses (executed in pairs).

Figure 10:
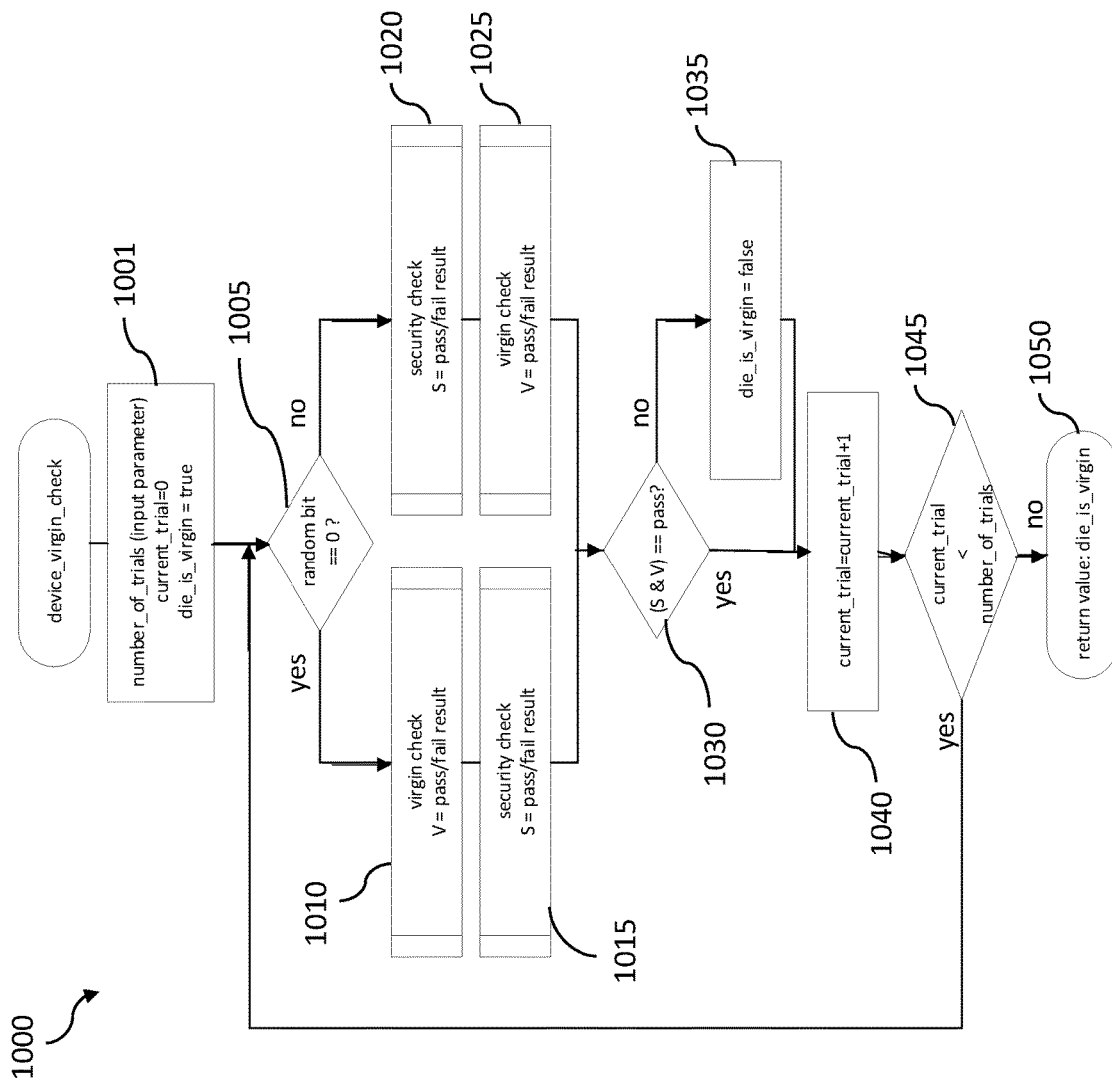
FIG. 10 is a flowchart depicting an example method for defeating an attack on a memory test for whether a nonvolatile memory (NVM) comprises virgin memory cells.

FIG. 10 provides an example method 1000 that can be implemented by the testing module to achieve this additional protection. At 1001, the testing sequence is initiated by setting a desired number of test iterations (trials), e.g. n trials; also, variables for counting the number of completed trials and for tracking the detected state of the device die are initialized. At 1005, the module may determine a randomized yes/no value, such as by reading the value (0 or 1) of a random bit from the module memory. The value of the bit determines which of the two checks is performed first, for example: if the bit is 0/cleared/false, the testing module first performs the virgin check 1010 and then the security check 1015; if the bit is 1/set/true, the testing module first performs the security check 1020 and then the virgin check 1025. At 1030, the module checks whether both the virgin and security checks passed. If not, then either the die is not a virgin die, or the testing has been compromised, and at 1035 the testing module sets the detected state accordingly (e.g., by setting the value of a variable "die_is_virgin" to false). If on the other hand both the virgin check and the safety check passed, the module makes no changes to the recorded detected state of the die—thus, if all trials so far have passed both checks, the die is being tracked as virgin, but if any previous trial did not pass both checks, the die remains tracked as "not virgin."

At 1040, the module may increment the counter for number of trials complete. At 1045, the module may determine whether the desired number of trials have now been performed. If not, the module returns to step 1005 to execute the next trial (note: without resetting the tracked state of the die); if all trials are finished, at 1050 the module may end the testing protocol and return the tracked state to the testing interface (or memory controller/system processor, according to the implementation).

The present disclosure describes various implementations of securely performing a check of NVM device memory arrays for an unformed or "virgin" state indicating data has never been written to the memory. In some aspects, the present disclosure provides a system including a test circuit configured to be coupled to a first array and a second array of a plurality of arrays of non-volatile memory cells in a memory device, each memory cell having a state that is either formed or unformed, wherein: in the formed state, the memory cell has been subject to a write operation for storing data in the memory cell; and, in the unformed state, the memory cell has never been subject to a write operation. The test circuit may include: biasing circuitry configured to subject a first memory cell of the first array to one or more biasing conditions; a sense amplifier electrically connected to the biasing circuitry and configured to produce a value corresponding to an electrical property of the first memory cell measured under the one or more biasing conditions; and, a processor configured to perform a virgin memory check. The virgin memory check comprises the steps of: causing the test circuit to apply a first biasing condition to the first memory cell; obtaining, from the test circuit as a first value, the value corresponding to the electrical property of the first memory cell measured under the first biasing condition; determining, based on the first value, the state of the first memory cell, wherein the first value being above a threshold indicates the state is formed and the first value being below the threshold indicates the state is unformed; when the state of the first memory cell is formed, performing one or more failure-mode actions associated with the memory device failing the virgin memory check; and, when the state of the first memory cell is unformed, performing a validation action to confirm that the test circuit is correctly operating.

The test circuit may be configured to electrically connect to an active bitline of the first array and to a reference bitline of the second array. To couple the test circuit to the first and second arrays, the sense amplifier may be configured to electrically connect to an active bitline of the first array and a reference bitline of the second array as inputs of the sense amplifier, the active bitline connecting to the first memory cell. The biasing circuitry may include: a precharge stage including electrical components operable to apply a voltage to the active bitline and the reference bitline; and, a current sink switchably connected to the reference bitline. Causing the test circuit to apply the first biasing condition to the first memory cell may comprise the steps of: causing the precharge stage to apply the voltage to the active bitline connected to the first memory cell and to the reference bitline connected to the second array; and, in parallel, causing the current sink to load the reference bitline connected to the second array, and causing a first wordline of the first array to activate, the first wordline being connected to the first memory cell, the sense amplifier responsively comparing corresponding rates of discharge of the active bitline and the reference bitline to produce the value. The value may indicate the first memory cell is formed if the active bitline discharges faster than the reference bitline, and the value may indicate the first memory cell is unformed if the reference bitline discharges faster than the active bitline.

The processor may be further configured to perform a security check comprising the steps of: causing the test circuit to apply a second biasing condition to the first memory cell, the second biasing condition configured to produce an expected value as the value corresponding to the electrical property of the first memory cell measured under the second biasing condition, the expected value being associated with the first memory cell being in the formed state; obtaining, from the test circuit as a second value, the value corresponding to the electrical property of the first memory cell measured under the second biasing condition; determining whether the second value is the expected value; responsive to determining that the second value is the expected value, produce a check signal indicating that the first memory cell comprises a virgin memory cell; and, responsive to determining that the second value is not the expected value, perform one or more of the failure-mode actions.

The sense amplifier may be configured to electrically connect to an active bitline of the first array at a first input of the sense amplifier and to a reference bitline of the second array at a second input of the sense amplifier. The sense amplifier may be further configured to, under any of the biasing conditions, responsively compare corresponding conductivity across the first and second inputs to produce the value. Causing the test circuit to apply the first biasing condition to the first memory cell comprises, in parallel: activating a selected wordline of the first array, the selected wordline connected to the first memory cell; and, causing the test circuit to connect a load to the reference bitline. Causing the test circuit to apply the second biasing condition to the first memory cell comprises, in parallel: activating a selected wordline of the first array, the selected wordline connected to the first memory cell; and, causing the test circuit to connect the load to the active bitline.

The processor may be further configured to: perform the virgin memory check and the security check during a boot process of the memory device; perform the virgin memory check and the security check sequentially as a secure virgin memory check; perform a predetermined number of repetitions of the secure virgin memory check on the first memory cell; and, for each repetition of the predetermined number of repetitions, randomly determine a sequence of the virgin memory check and the security check within the secure virgin memory check.

In another aspect, the present disclosure provides a system including: a test circuit for a memory device including a first array of non-volatile memory cells, each memory cell of the first array being in either a first state associated with the memory cell having been subject to a write operation for testing or storing data in the memory cell, or a second state associated with the memory cell having never been subject to a write operation; and, a processor configured to perform a virgin memory check of the memory device. The virgin memory check may comprise the steps of: causing the test circuit to apply a first biasing condition to a first memory cell of the first array of non-volatile memory cells; obtaining, from the test circuit, a first value corresponding to an electrical property of the first memory cell measured under the first biasing condition; determining, based on the first value, that the first memory cell is in the first state or the second state; responsive to determining that the first memory cell is in the first state, produce a virgin check signal indicating that the memory device failed the virgin memory check; and, responsive to determining that the first memory cell is in the second state, produce the virgin check signal indicating that the first memory cell passed the virgin memory check and perform a validation action to confirm that the test circuit is correctly operating.

Determining that the first memory cell is in the first state or the second state may comprise the steps of: comparing the first value to a threshold selected to differentiate non-volatile memory cells in the first state from non-volatile memory cells in the second state based on the electrical property of the non-volatile memory cells; responsive to a determination that the first value does not satisfy the threshold, determine that the first memory cell is in the first state; and, responsive to a determination that the first value satisfies the threshold, determine that the first memory cell is in the second state. The non-volatile memory cells may comprise resistive random access memory cells, and the electrical property may be the electrical resistance of the memory cell. Or, the electrical property may be conductivity of the memory cell, and the threshold may be between zero and two microamps, inclusive.

The processor may be further configured to perform a security check of the memory device, the security check comprising the steps of: causing the test circuit to apply a second biasing condition to the first memory cell; obtaining, from the test circuit, a second value corresponding to the electrical property of the first memory cell measured under the second biasing condition; determining whether the second value matches an expected value associated with applying the second biasing condition; responsive to determining that the second value matches the expected value, produce a security check signal indicating that the security check passed; and, responsive to determining that the second value does not match the expected value, produce the security check signal indicating that the security check failed. The validation action may include performing the security check.

The processor may be configured to perform the virgin memory check and the security check as a pair of tests of the first memory cell, and the validation action may include determining that the security check of the first memory cell passed.

The memory device may further includes a second array of non-volatile memory cells; the test circuit may be configured to electrically connect to an active bitline of the first array and to a reference bitline of the second array, the active bitline connecting to the first memory cell. The test circuit may include: biasing circuitry electrically connected to and switchable between the active bitline and the reference bitline and configured to subject the first memory cell to the first and second biasing conditions; and, a sense amplifier electrically connected to the biasing circuitry and configured to produce a value corresponding to the electrical property of the first memory cell measured under either of the first and second biasing conditions. The processor may be configured to operate the biasing circuitry to switchably connect either of the active bitline and the reference bitline to one or more voltage sources and to one or more current sinks. Causing the test circuit to apply the first biasing condition to the first memory cell may comprise the steps of: causing the biasing circuitry to pre-charge the active bitline of the first array and the reference bitline of the second array of the memory device, without connected loads; and, in parallel, activating a first wordline of the first array and connecting a current sink to load the reference bitline. Causing the test circuit to apply the second biasing condition to the first memory cell may comprise the steps of: causing the biasing circuitry to pre-charge the active bitline of the first array and the reference bitline of the second array, without connected loads; and, in parallel, activating the first wordline of the first array and connecting the current sink to load the active bitline.

The processor may be configured to operate the biasing circuitry to apply a reference current to the reference bitline and to switchably apply an offset current to either of the active bitline and the reference bitline. Causing the test circuit to apply the first biasing condition to the first memory cell may comprise causing the biasing circuitry to apply the offset current to the active bitline to produce a positive net current of the first biasing condition (of, e.g., between 0 and 1.5 microamps); and, causing the test circuit to apply the second biasing condition to the first memory cell may comprise causing the biasing circuitry to apply the offset current to the reference bitline to produce a virtually negative net current of the second biasing condition (of, e.g., between 0 and −1.5 microamps).

In another aspect, the present disclosure provides a method including the steps of: using a test circuit to apply a first biasing condition to a first memory cell of a first array of non-volatile memory cells; obtaining, from the test circuit, a first value corresponding to an electrical property of the first memory cell; comparing the first value to a threshold associated with the electrical property to determine that the first memory cell is one of a formed memory cell to which data has been written, or an unformed memory cell to which data has never been written; responsive to a determination that the first memory cell is a formed memory cell, producing a virgin memory check signal indicating that a memory die comprising the first array is not a virgin memory die; and, responsive to a determination that the first memory cell is an unformed memory cell, producing the virgin memory check signal to indicate that the first memory cell passed a virgin memory check. The method may further include the steps of: using the test circuit to apply a second biasing condition to the first memory cell; obtaining, from the test circuit, a second value corresponding to the electrical property of the first memory cell; comparing the second value to an expected value associated with the second biasing condition; responsive to a determination that the second value matches the expected value, producing a security check signal indicating that a security check was passed; and, responsive to a determination that the second value does not match the expected value, producing the security check signal to indicate that the security check was not passed.

The method may further include performing the virgin memory check and the security check sequentially as a secure virgin check of the first memory cell. The method may further include randomly determining a sequence of the virgin memory check and the security check. The method may further include performing a predetermined number of repetitions of the secure virgin check of the first memory cell.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. Similarly, the description may refer to a left-hand or right-hand bit in one of the present atomic flags. It should be understood that such terms are utilized to provide a clear description of an implementation of the invention and that the various bits of the present atomic flags may be implemented in any order in memory and, in fact, the multiple bits making up the presents atomic flag could be implemented in different regions of a memory or across multiple different memory devices. Similar, the present description may describe a particular memory cell being set when having a signal value greater than a threshold and cleared when the cell's signal value is less than that threshold. It will be apparent to the person of ordinary skill in the art that such definitions may be reversed so that a particular cell may be set when its signal value falls below a threshold and the cell is cleared when its value falls above the same or a different threshold.

The present disclosure makes reference to threshold values and the determination of whether a particular memory cell is set or cleared based upon a comparison of a signal value of the memory cell to such a threshold value. As such, in embodiments, it is described that a memory cell is set when its signal value exceeds the cell's threshold. It should be understood and is expressly contemplated that the concept of "exceeding" a threshold includes the opposite configuration in which a particular memory cell is considered set when its signal value falls below (i.e., exceeds, but in a negative direction) the threshold value. Similarly, references to "falling below" a threshold are expressly contemplated to include implementations in which a particular memory cell is considered cleared when its signal value is above (i.e., falls below, in a negative direction) the threshold value.

The term "coupled" is defined as connected, although not necessarily directly, and not necessarily mechanically. The terms "a" and "an" are defined as one or more unless stated otherwise. The terms "comprise" and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

What is claimed is:

1. A system, comprising:
a test circuit configured to be coupled to a first array and a second array of a plurality of arrays of non-volatile memory cells in a memory device, each memory cell having a state that is either formed or unformed, wherein:
  in the formed state, the memory cell has been subject to a write operation for storing data in the memory cell; and
  in the unformed state, the memory cell has never been subject to a write operation;
the test circuit comprising:
  biasing circuitry configured to subject a first memory cell of the first array to one or more biasing conditions; and
  a sense amplifier electrically connected to the biasing circuitry and configured to produce a value corresponding to an electrical property of the first memory cell measured under the one or more biasing conditions; and
a processor configured to perform a virgin memory check comprising the steps of:
  causing the test circuit to apply a first biasing condition to the first memory cell;
  obtaining, from the test circuit as a first value, the value corresponding to the electrical property of the first memory cell measured under the first biasing condition;
  determining, based on the first value, the state of the first memory cell, wherein the first value being above a threshold indicates the state is formed and the first value being below the threshold indicates the state is unformed;
  when the state of the first memory cell is formed, performing one or more failure-mode actions associated with the memory device failing the virgin memory check; and
  when the state of the first memory cell is unformed, performing a validation action to confirm that the test circuit is correctly operating.

2. The system of claim 1, wherein:
to couple the test circuit to the first and second arrays, the sense amplifier is configured to electrically connect to an active bitline of the first array and a reference bitline of the second array as inputs of the sense amplifier, the active bitline connecting to the first memory cell;
the biasing circuitry comprises:
  electrical components operable to apply a voltage to the active bitline and the reference bitline; and
  a current sink switchably connected to the reference bitline; and
causing the test circuit to apply the first biasing condition to the first memory cell comprises the steps of:
  causing the electrical components to apply the voltage to the active bitline connected to the first memory cell and to the reference bitline connected to the second array; and
  in parallel, causing the current sink to load the reference bitline connected to the second array, and causing a first wordline of the first array to activate, the first wordline being connected to the first memory cell, the sense amplifier responsively comparing corresponding rates of discharge of the active bitline and the reference bitline to produce the value;
wherein the value indicates the first memory cell is formed if the active bitline discharges faster than the reference bitline, and the value indicates the first memory cell is unformed if the reference bitline discharges faster than the active bitline.

3. The system of claim 1, wherein the processor is further configured to perform a security check comprising the steps of:
  causing the test circuit to apply a second biasing condition to the first memory cell, the second biasing condition configured to produce an expected value as the value corresponding to the electrical property of the first memory cell measured under the second biasing condition, the expected value being associated with the first memory cell being in the formed state;
  obtaining, from the test circuit as a second value, the value corresponding to the electrical property of the first memory cell measured under the second biasing condition;
  determining whether the second value is the expected value;
  responsive to determining that the second value is the expected value, produce a check signal indicating that the first memory cell comprises a virgin memory cell; and
  responsive to determining that the second value is not the expected value, perform one or more of the failure-mode actions.

4. The system of claim 3, wherein:
the sense amplifier is configured to electrically connect to an active bitline of the first array at a first input of the sense amplifier and to a reference bitline of the second array at a second input of the sense amplifier;
the sense amplifier is further configured to, under any of the biasing conditions, responsively compare corresponding conductivity across the first and second inputs to produce the value;
causing the test circuit to apply the first biasing condition to the first memory cell comprises, in parallel:
  activating a selected wordline of the first array, the selected wordline connected to the first memory cell; and
  causing the test circuit to connect a load to the reference bitline; and
causing the test circuit to apply the second biasing condition to the first memory cell comprises, in parallel:
  activating a selected wordline of the first array, the selected wordline connected to the first memory cell; and
  causing the test circuit to connect the load to the active bitline.

5. The system of claim 3, wherein the processor is further configured to:
perform the virgin memory check and the security check during a boot process of the memory device;
perform the virgin memory check and the security check sequentially as a secure virgin memory check;
perform a predetermined number of repetitions of the secure virgin memory check on the first memory cell; and
for each repetition of the predetermined number of repetitions, randomly determine a sequence of the virgin memory check and the security check within the secure virgin memory check.

6. A system, comprising:
a test circuit for a memory device including a first array of non-volatile memory cells, each memory cell of the first array being in either a first state associated with the memory cell having been subject to a write operation for testing or storing data in the memory cell, or a second state associated with the memory cell having never been subject to a write operation; and
a processor configured to perform a virgin memory check of the memory device, the virgin memory check comprising the steps of:
causing the test circuit to apply a first biasing condition to a first memory cell of the first array of non-volatile memory cells;
obtaining, from the test circuit, a first value corresponding to an electrical property of the first memory cell measured under the first biasing condition;
determining, based on the first value, that the first memory cell is in the first state or the second state;
responsive to determining that the first memory cell is in the first state, produce a virgin check signal indicating that the memory device failed the virgin memory check; and
responsive to determining that the first memory cell is in the second state:
produce the virgin check signal indicating that the first memory cell passed the virgin memory check; and
perform a validation action to confirm that the test circuit is correctly operating.

7. The system of claim 6, wherein determining that the first memory cell is in the first state or the second state comprises:
comparing the first value to a threshold selected to differentiate non-volatile memory cells in the first state from non-volatile memory cells in the second state based on the electrical property of the non-volatile memory cells;
responsive to a determination that the first value does not satisfy the threshold, determine that the first memory cell is in the first state; and
responsive to a determination that the first value satisfies the threshold, determine that the first memory cell is in the second state.

8. The system of claim 7, wherein the non-volatile memory cells comprise resistive random access memory cells and the electrical property comprises electrical resistance of the memory cell.

9. The system of claim 7, wherein the electrical property comprises conductivity of the memory cell and the threshold is between zero and two microamps, inclusive.

10. The system of claim 6, wherein the processor is further configured to perform a security check of the memory device, the security check comprising the steps of:
causing the test circuit to apply a second biasing condition to the first memory cell;
obtaining, from the test circuit, a second value corresponding to the electrical property of the first memory cell measured under the second biasing condition;
determining whether the second value matches an expected value associated with applying the second biasing condition;
responsive to determining that the second value matches the expected value, produce a security check signal indicating that the security check passed; and
responsive to determining that the second value does not match the expected value, produce the security check signal indicating that the security check failed.

11. The system of claim 10, wherein the validation action comprises performing the security check.

12. The system of claim 10, wherein the processor is configured to perform the virgin memory check and the security check as a pair of tests of the first memory cell, and wherein the validation action comprises determining that the security check of the first memory cell passed.

13. The system of claim 10, wherein the memory device further includes a second array of non-volatile memory cells and the test circuit is configured to electrically connect to an active bitline of the first array and to a reference bitline of the second array, the active bitline connecting to the first memory cell, and wherein the test circuit comprises:
biasing circuitry electrically connected to and switchable between the active bitline and the reference bitline and configured to subject the first memory cell to the first and second biasing conditions; and
a sense amplifier electrically connected to the biasing circuitry and configured to produce a value corresponding to the electrical property of the first memory cell measured under either of the first and second biasing conditions.

14. The system of claim 13, wherein:
the processor is configured to operate the biasing circuitry to switchably connect either of the active bitline and the reference bitline to one or more voltage sources and to one or more current sinks;
causing the test circuit to apply the first biasing condition to the first memory cell comprises:
causing the biasing circuitry to pre-charge the active bitline of the first array and the reference bitline of the second array of the memory device, without connected loads; and
in parallel, activating a first wordline of the first array and connecting a current sink to load the reference bitline; and
causing the test circuit to apply the second biasing condition to the first memory cell comprises:
causing the biasing circuitry to pre-charge the active bitline of the first array and the reference bitline of the second array, without connected loads; and
in parallel, activating the first wordline of the first array and connecting the current sink to load the active bitline.

15. The system of claim 13, wherein:
the processor is configured to operate the biasing circuitry to apply a reference current to the reference bitline and to switchably apply an offset current to either of the active bitline and the reference bitline;
causing the test circuit to apply the first biasing condition to the first memory cell comprises causing the biasing circuitry to apply the offset current to the active bitline to produce a positive net current of the first biasing condition; and causing the test circuit to apply the second biasing condition to the first memory cell comprises causing the biasing circuitry to apply the offset current to the reference bitline to produce a virtually negative net current of the second biasing condition.

16. A method, comprising:

using a test circuit to apply a first biasing condition to a first memory cell of a first array of non-volatile memory cells;

obtaining, from the test circuit, a first value corresponding to an electrical property of the first memory cell;

comparing the first value to a threshold associated with the electrical property to determine that the first memory cell is one of a formed memory cell to which data has been written, or an unformed memory cell to which data has never been written;

responsive to a determination that the first memory cell is a formed memory cell, producing a virgin memory check signal indicating that a memory die comprising the first array is not a virgin memory die; and responsive to a determination that the first memory cell is an unformed memory cell, producing the virgin memory check signal to indicate that the first memory cell passed a virgin memory check.

17. The method of claim 16, further comprising:

using the test circuit to apply a second biasing condition to the first memory cell;

obtaining, from the test circuit, a second value corresponding to the electrical property of the first memory cell;

comparing the second value to an expected value associated with the second biasing condition;

responsive to a determination that the second value matches the expected value, producing a security check signal indicating that a security check was passed; and responsive to a determination that the second value does not match the expected value, producing the security check signal to indicate that the security check was not passed.

18. The method of claim 17, further comprising performing the virgin memory check and the security check sequentially as a secure virgin check of the first memory cell.

19. The method of claim 18, further comprising randomly determining a sequence of the virgin memory check and the security check.

20. The method of claim 18, further comprising performing a predetermined number of repetitions of the secure virgin check of the first memory cell.

* * * * *